United States Patent
Robinson et al.

(10) Patent No.: US 6,805,615 B1
(45) Date of Patent: *Oct. 19, 2004

(54) PLANARIZING SOLUTIONS, PLANARIZING MACHINES AND METHODS FOR MECHANICAL OR CHEMICAL-MECHANICAL PLANARIZATION OF MICROELECTRONIC-DEVICE SUBSTRATE ASSEMBLIES

(75) Inventors: Karl M. Robinson, Boise, ID (US); Scott G. Meikle, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/706,493

(22) Filed: Nov. 2, 2000

Related U.S. Application Data (62) Division of application No. 09/289,791, filed on Apr. 9, 1999.

(51) Int. Cl.[7] ............................................. B24B 7/30
(52) U.S. Cl. ............................ 451/41; 438/693; 51/307; 51/308
(58) Field of Search ................................. 438/690–693

(56) References Cited

U.S. PATENT DOCUMENTS

| | | | | |
|---|---|---|---|---|
| 4,959,113 A | | 9/1990 | Roberts ...................... 156/636 |
| 5,264,010 A | * | 11/1993 | Brancaleoni et al. .......... 51/308 |
| 5,725,417 A | | 3/1998 | Robinson ..................... 451/56 |
| 5,863,838 A | | 1/1999 | Farkas et al. ................ 438/693 |
| 5,868,896 A | | 2/1999 | Robinson et al. ........... 156/344 |
| 5,869,392 A | | 2/1999 | Kimura ....................... 438/620 |
| 5,882,248 A | | 3/1999 | Wright et al. ............... 451/285 |
| 5,893,754 A | | 4/1999 | Robinson et al. ........... 438/692 |
| 5,904,159 A | | 5/1999 | Kato et al. ..................... 134/7 |
| 5,932,486 A | | 8/1999 | Cook et al. .................. 438/692 |
| 5,954,997 A | * | 9/1999 | Kaufman et al. ........... 252/79.1 |
| 5,981,396 A | | 11/1999 | Robinson et al. ........... 438/692 |
| 6,046,111 A | * | 4/2000 | Robinson ..................... 438/693 |
| 6,077,437 A | | 6/2000 | Hayashi et al. ............. 210/651 |
| 6,083,840 A | | 7/2000 | Mravic et al. .............. 438/693 |
| 6,093,649 A | | 7/2000 | Roberts et al. ............. 438/691 |
| 6,106,714 A | | 8/2000 | Chiu et al. ............. 210/321.63 |
| 6,106,728 A | | 8/2000 | Iida et al. ................... 210/743 |
| 6,124,207 A | * | 9/2000 | Robinson et al. ........... 438/692 |
| 6,407,000 B1 | * | 6/2002 | Hudson ....................... 438/693 |

* cited by examiner

*Primary Examiner*—Nadine G. Norton
*Assistant Examiner*—Duy-Vu Deo
(74) *Attorney, Agent, or Firm*—Dorsey & Whitney LLP (57) ABSTRACT

A method and apparatus for making and using slurries for planarizing microelectronic-device substrate assemblies in mechanical and/or chemical-mechanical planarization processes. In one aspect of the invention, a bi-modal slurry is fabricated by removing a first type of selected abrasive particles from a first abrasive particle solution to form a treated flow of the first solution. The treated flow of the first solution is then combined with a flow of a second solution having a plurality of second abrasive particles. The abrasive particles of the first type are accordingly removed from the first solution separately from the second solution such that the second abrasive particles in the second solution do not affect the removal of the abrasive particles of the first type from the first solution. In another aspect of the invention, a second type of selected abrasive particles are removed from the second solution prior to mixing with the first solution. Thus, by combining the treated flow of the first solution with either the treated or untreated flow of the second solution, a single flow of an abrasive slurry is produced having a first distribution of the first abrasive particles about a first mode and a second distribution of the second abrasive particles about a second mode.

18 Claims, 5 Drawing Sheets

PLANARIZING SOLUTIONS, PLANARIZING MACHINES AND METHODS FOR MECHANICAL OR CHEMICAL-MECHANICAL PLANARIZATION OF MICROELECTRONIC-DEVICE SUBSTRATE ASSEMBLIES

CROSS-REFERENCE TO RELATED APPLICATION

This application is a divisional of pending U.S. patent application Ser. No. 09/289,791, filed Apr. 9, 1999.

TECHNICAL FIELD

The present invention relates to bi-modal slurries for planarizing microelectronic-device substrate assemblies, and to methods and apparatuses for making and using such slurries in mechanical and/or chemical-mechanical planarization processes.

BACKGROUND OF THE INVENTION

Mechanical and chemical-mechanical planarizing processes (collectively "CMP") are used in the manufacturing of microelectronic devices for forming a flat surface on semiconductor wafers, field emission displays and many other microelectronic-device substrate assemblies. CMP processes generally remove material from a substrate assembly to create a highly planar surface at a precise elevation in the layers of material on the substrate assembly.

Figure 1:
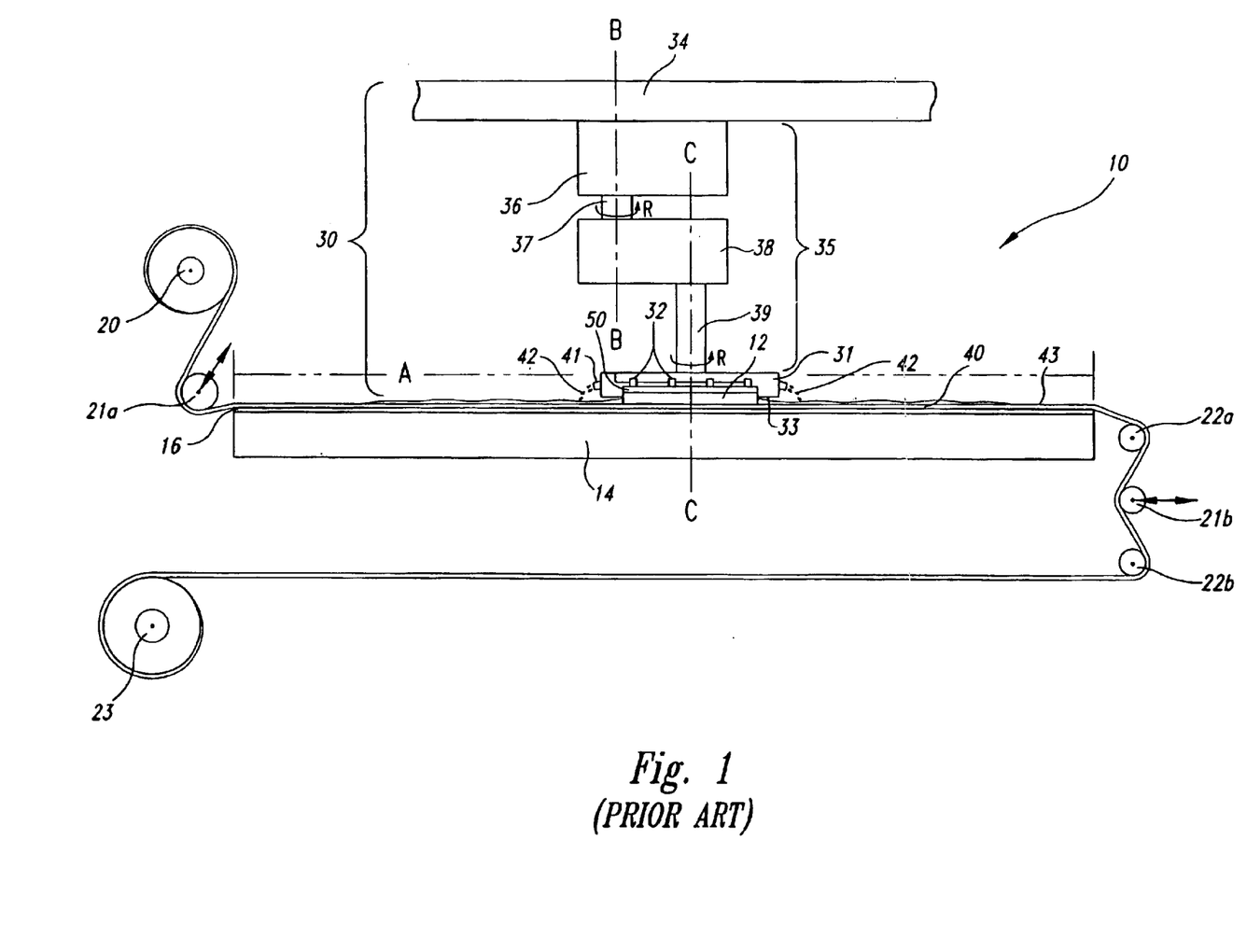
FIG. 1 is a schematic cross-sectional view of a planarizing machine in accordance with the prior art.

FIG. 1 schematically illustrates an existing web-format planarizing machine 10 for planarizing a substrate assembly 12. The planarizing machine 10 has a support table 14 with a top panel 16 at a workstation where an operative portion (A) of a polishing pad 40 is positioned. The top panel 16 is generally a rigid plate to provide a flat, solid surface to support the operative section of the polishing pad 40 during planarization.

The planarizing machine 10 also has a plurality of rollers to guide, position and hold the polishing pad 40 over the top panel 16. The rollers include a supply roller 20, first and second idler rollers 21a and 21b, first and second guide rollers 22a and 22b, and a take-up roller 23. The supply roller 20 carries an unused or preoperative portion of the polishing pad 40, and the take-up roller 23 carries a used or post-operative portion of the polishing pad 40. Additionally, the first idler roller 21a and the first guide roller 22a stretch the polishing pad 40 over the top panel 16 to hold the polishing pad 40 stationary during operation. A drive motor (not shown) drives at least one of the supply roller 20 and the take-up roller 23 to sequentially advance the polishing pad 40 across the top panel 16. As such, clean preoperative sections of the polishing pad 40 may be quickly substituted for used sections to provide a consistent surface for planarizing the substrate assembly 12.

The web-format planarizing machine 10 also has a carrier assembly 30 that controls and protects the substrate assembly 12 during planarization. The carrier assembly 30 generally has a carrier head 31 with a plurality of vacuum holes 32 to pick up and release the substrate assembly 12 at appropriate stages of the planarizing cycle. A plurality of nozzles 41 attached to the carrier head 31 dispense a planarizing solution 42 onto a planarizing surface 43 of the polishing pad 40. The carrier assembly 30 also generally has a support gantry 34 carrying a drive assembly 35 that translates along the gantry 34. The drive assembly 35 generally has actuator 36, a drive shaft 37 coupled to the actuator 36, and an arm 38 projecting from the drive shaft 37. The arm 38 carries the carrier head 31 via another shaft 39 such that the drive assembly 35 orbits the carrier head 31 about an axis B—B offset from a center point C—C of the substrate assembly 12.

The polishing pad 40 and the planarizing solution 42 define a planarizing medium that mechanically and/or chemically-mechanically removes material from the surface of the substrate assembly 12. The web-format planarizing machine 10 typically uses a fixed-abrasive polishing pad having a plurality of abrasive particles fixedly bonded to a suspension material. The planarizing solutions 42 used with fixed-abrasive pads are generally "clean solutions" without abrasive particles because the abrasive particles in conventional abrasive CMP slurries may ruin the abrasive surface of fixed-abrasive pads. In other applications, the polishing pad 40 may be a nonabrasive pad composed of a polymeric material (e.g., polyurethane), a resin, or other suitable materials without abrasive particles. The planarizing solutions 42 used with nonabrasive polishing pads are typically "abrasive" CMP slurries with abrasive particles.

To planarize the substrate assembly 12 with the planarizing machine 10, the carrier assembly 30 presses the substrate assembly 12 against the planarizing surface 43 of the polishing pad 40 in the presence of the planarizing solution 42. The drive assembly 35 then orbits the carrier head 31 about the offset axis B—B to translate the substrate assembly 12 across the planarizing surface 43. As a result, the abrasive particles and/or the chemicals in the planarizing medium remove material from the surface of the substrate assembly 12.

CMP processes should consistently and accurately produce a uniformly planar surface on the substrate assembly 12 to enable precise fabrication of circuits and photo-patterns. For example, during the fabrication of transistors, contacts, interconnects and other components, many substrate assemblies develop large "step heights" that create a highly topographic surface across the substrate assembly 12. To enable the fabrication of integrated circuits with high densities of components, it is necessary to produce a highly planar substrate surface at several stages of processing the substrate assembly 12 because non-planar substrate surfaces significantly increase the difficulty of forming submicron features. For example, it is difficult to accurately focus photo-patterns to within tolerances of 0.1 $\mu$m on nonplanar substrate surfaces because submicron photolithographic equipment generally has a very limited depth of field. Thus, CMP processes are often used to transform a topographical substrate surface into a highly uniform, planar substrate surface.

In the competitive semiconductor industry, it is also highly desirable to have a high yield of operable devices after CMP processing by quickly producing a uniformly planar surface at a desired endpoint on a substrate assembly. For example, when a conductive layer on the substrate assembly 12 is under-planarized in the formation of contacts or interconnects, many of these components may not be electrically isolated from one another because undesirable portions of the conductive layer may remain on the substrate assembly 12. Additionally, when a substrate assembly 12 is over-planarized, components below the desired endpoint may be damaged or completely destroyed. Thus, to provide a high yield of operable microelectronic devices, CMP processing should quickly remove material until the desired endpoint is reached.

To accurately create highly planar substrate surfaces at the desired endpoint, the particle size distribution of planarizing slurries should be consistent from one planarizing cycle to another. One problem with CMP processing, however, is that the abrasive particles may be unstable in the slurry. For example, because many types of abrasive particles have a large affinity for one another, individual particles in a liquid solution may agglomerate into larger abrasive elements. The formation of such abrasive elements affects the consistency of the slurry because the extent that the particles agglomerate varies from one batch of slurry to another, or even within a single batch of slurry as it is delivered to the planarizing machine. Additionally, large abrasive elements may scratch the substrate assemblies and produce defects, or they may settle out of the solution. Thus, the agglomeration of abrasive particles is a serious problem for processing substrate assemblies with CMP processing.

One particularly promising CMP slurry being developed by Micron Technology, Inc. is a liquid solution having a plurality of first and second abrasive particles. The first and second abrasive particles are typically composed of the same material, such as ceria or silica treated ceria abrasive particles. The difference between the first and second abrasive particles is the size of the particles. This slurry accordingly has a "bi-modal" distribution of abrasive particles in which the first abrasive particles have particles sizes in a first size distribution about a first mode and the second abrasive particles have particle sizes in a second size distribution about a second mode. In contrast to "singlet" slurries that have only one mode and a signal size distribution of abrasive particles about that mode, bi-modal slurries are expected to exhibit unusually good polishing rates and planarity on both topographical and planar substrate surfaces.

Although bi-modal slurries can produce good results, they may fail to achieve consistent results because the abrasive particles are highly unstable in the solution. The bi-modal slurries mixed by Micron Technology Inc. from components supplied by Rodel Corporation may even change from one planarizing cycle to the next, which greatly increases the difficulty in accurately planarizing substrate assemblies. To resolve the instability of these slurries, a point-of-use filtering may be performed at the planarizing machine of a single flow of a bi-modal slurry having both the first and second planarizing particles. Filtering the bi-modal slurry, however, may alter the bi-modal distribution of abrasive particles to the extent that the bi-modal slurry loses at least some of the advantages of using two different particle sizes. Therefore, there is a need for improved bi-modal slurry techniques in CMP processing to achieve the potential advantages of such slurries.

SUMMARY OF THE INVENTION

The present invention is directed toward methods and apparatuses for making and using slurries for planarizing microelectronic-device substrate assemblies in mechanical and/or chemical-mechanical planarization processes. In one aspect of the invention, a bi-modal slurry is fabricated by removing a first type of selected abrasive particles from a first abrasive particle solution to form a treated flow of the first solution. The treated flow of the first solution is then combined with a flow of a second solution having a plurality of second abrasive particles. A single flow of an abrasive slurry thus has a first distribution of the first abrasive particles and a second distribution of the second abrasive particles.

In another aspect of the invention, a bi-modal abrasive slurry is manufactured by also separating a second type of selected abrasive particles from the second solution prior to combining the first solution with the second solution. Thus, the first and second solutions can be treated independently to avoid affecting the treatment of one solution by treating the other solution.

In still another aspect of the invention, a planarizing apparatus for planarizing a substrate assembly in accordance with the invention includes a slurry manufacturing assembly, and a dispenser coupled to the slurry manufacturing assembly. The slurry manufacturing assembly can include a first feed line for containing the first flow of the first solution having the plurality of the first abrasive particles, a second feed line for containing the second flow of the second solution having the plurality of second abrasive particles, a first filter coupled to the first feed line to filter the plurality of the first abrasive particles separately from the second flow of the second solution, and a combined feed line operatively coupled to the first filter and the second feed line for containing a combined flow of the first and second solutions after filtering the first solution.

DETAILED DESCRIPTION OF THE INVENTION

The present invention is directed to methods and apparatuses for making and using slurries for planarizing microelectronic-device substrate assemblies in mechanical and/or chemical-mechanical planarization processes. Many specific details of certain embodiments of the invention are set forth in FIGS. 2–5 and the following description to provide a thorough understanding of such embodiments. One skilled in the art, however, will understand that the present invention may have additional embodiments, or that certain embodiments of the invention may be practiced without several of the details described in the following description.

Figure 2:
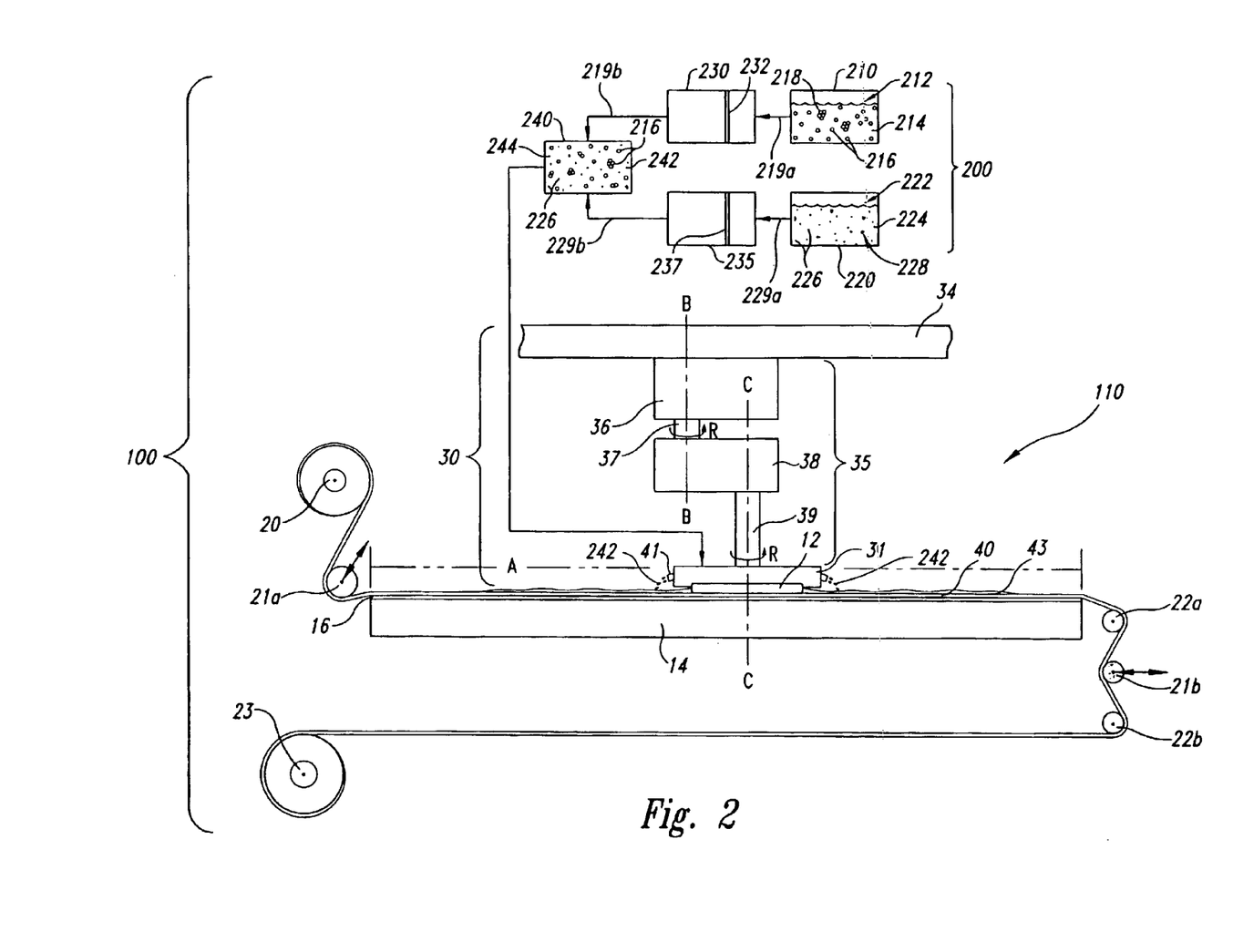
FIG. 2 is a schematic side view of a planarizing system including a planarizing machine and a slurry manufacturing assembly in accordance with one embodiment of the invention.

FIG. 2 is a schematic side view illustrating a planarizing system 100 having a planarizing machine 110 and a slurry manufacturing assembly 200 in accordance with one embodiment of the invention. The planarizing machine 110 shown in FIG. 2 is similar to the web-format planarizing machine 10 described above with reference to FIG. 1, and thus like reference numbers refer to like parts. The planarizing machine 110 can also be a rotary planarizing machine having a rotating platen and a circular polishing pad, as set forth in U.S. Pat. Nos. 5,645,682 and 5,792,709, which are both herein incorporated by reference. Suitable web-format planarizing machines without the slurry manufacturing assembly 200 are manufactured by Obsidian Corporation. Suitable rotary planarizing machines without the slurry manufacturing assembly 200 are manufactured by Westech Corporation and Strasbaugh Corporation.

The slurry manufacturing assembly 200 generally includes a first supply container 210 containing a first solution 212 and a second supply container 220 containing a second solution 222. In this particular embodiment, the slurry manufacturing assembly 200 also includes a first particle removal unit 230 coupled to the first container 210, a second particle removal unit 235 coupled to the second container 220, and a mixing unit 240 coupled to the first and second particle removal units 230 and 235. As explained below, the first and second particle removal units 230 and 235 are preferably first and second filtration units that separately filter selected abrasive particles from the first and second solutions 212 and 222. The filtered first and second solutions 212 and 222 are then combined in the mixing unit 240 to form an abrasive slurry 242 for planarizing the substrate assembly 12 on the planarizing machine 110.

The first solution 212 is a first slurry component of the abrasive slurry 242. The first solution 212 preferably includes water, chemical additives (e.g., dispersants, surfactants, oxidants and other additives), and a plurality of first abrasive particles 216. The first abrasive particles 216 can be aluminum oxide particles, ceria particles, silicon dioxide particles, titanium oxide particles, tantalum oxide particles, ceria treated silica particles, or other suitable abrasive particles for removing material from microelectronic device substrate assemblies. The first abrasive particles 216 are preferably the larger particles of a bi-modal abrasive slurry having particle sizes from approximately 0.070–1.0 $\mu$m, and more preferably from approximately 0.070–0.40 $\mu$m. When the first solution 212 is in the first container 210 prior to being mixed with the second solution 222, a significant percentage of the first abrasive particles 216 in the first solution 212 may agglomerate to form first particle agglomerations 218. Each first particle agglomeration 218 may accordingly include two or more individual abrasive particles 216. The individual abrasive particles 216 of the first particle agglomerations 218 are generally bonded together electronically, covalently, or by van der walls interaction.

The second solution 222 is accordingly a second component of the mixed slurry 242. The second solution 222 generally includes a liquid 224, the same additives that are in the first solution 212, and a plurality of second abrasive particles 226. The second abrasive particles 226 can also be composed of the same material as the first abrasive particles 216 in the first solution 212, such as aluminum oxide particles, ceria particles, silicon dioxide particles, titanium oxide particles, tantalum oxide particles, ceria treated silica particles, or other suitable abrasive particles for removing material from microelectronic device substrate assemblies. The second abrasive particles 226 are preferably the smaller particles of a bi-modal abrasive slurry having particle sizes from approximately 0.005–0.20 $\mu$m, and more preferably from approximately 0.010–0.050 $\mu$m. As with the first solution 212, many of the abrasive particles 226 in the second solution 222 may agglomerate into second particle agglomerations 228.

The first particle removal unit 230 of this embodiment is coupled to a first feed line 219 (indicated by reference numbers 219a and 219b) between the first container 210 and the mixing unit 240. The first particle removal unit 230 removes a first type of selected abrasive particles from the first solution 212. The first particle removal unit 230, for example, can have a filter 232 that removes large individual abrasive particles 216 and first particle agglomerations 218 having sizes greater than a first maximum particle size for the first abrasive particles. For example, to create a first particle size distribution from approximately 0.070–1.0 $\mu$m, the first particle removal unit 230 removes first abrasive particles 216 and particle agglomerations 218 having sizes greater than 1.0 $\mu$m. Similarly, to create a first particle size distribution from approximately 0.070–0.40 $\mu$m, the first particle removal unit 230 removes first abrasive particles 216 and particle agglomerations 218 having sizes greater than 0.40 $\mu$m. Suitable filters for removing the first type of selected abrasive particles from the first solution 212 are manufactured by Millipore Corporation.

The second particle removal unit 235 of this embodiment is coupled to a feed line 229 (indicated by reference numbers 229a and 229b) between the second container 220 and the mixing unit 240. The second particle removal unit 235 removes a second type of abrasive particles from the second solution 222. The second particle removal unit 235 can also have a filter 237 that removes large second abrasive particles 226 and second particle agglomerations 228 having sizes greater than a second maximum particle size. For example, to create a second particle size distribution from approximately 0.010–0.20 $\mu$m, the second particle removal unit 235 removes second abrasive particles 226 and particle agglomerations 228 having sizes greater than 0.20 $\mu$m. Similarly, to create a second particle size distribution from approximately 0.010–0.050 $\mu$m, the second particle removal unit 235 removes second abrasive particles 226 and particle agglomerations 228 having sizes greater than 0.050 $\mu$m. Suitable filters for removing the second type of selected abrasive particles from the second abrasive particles 226 are also manufactured by Millipore Corporation.

Figure 3:
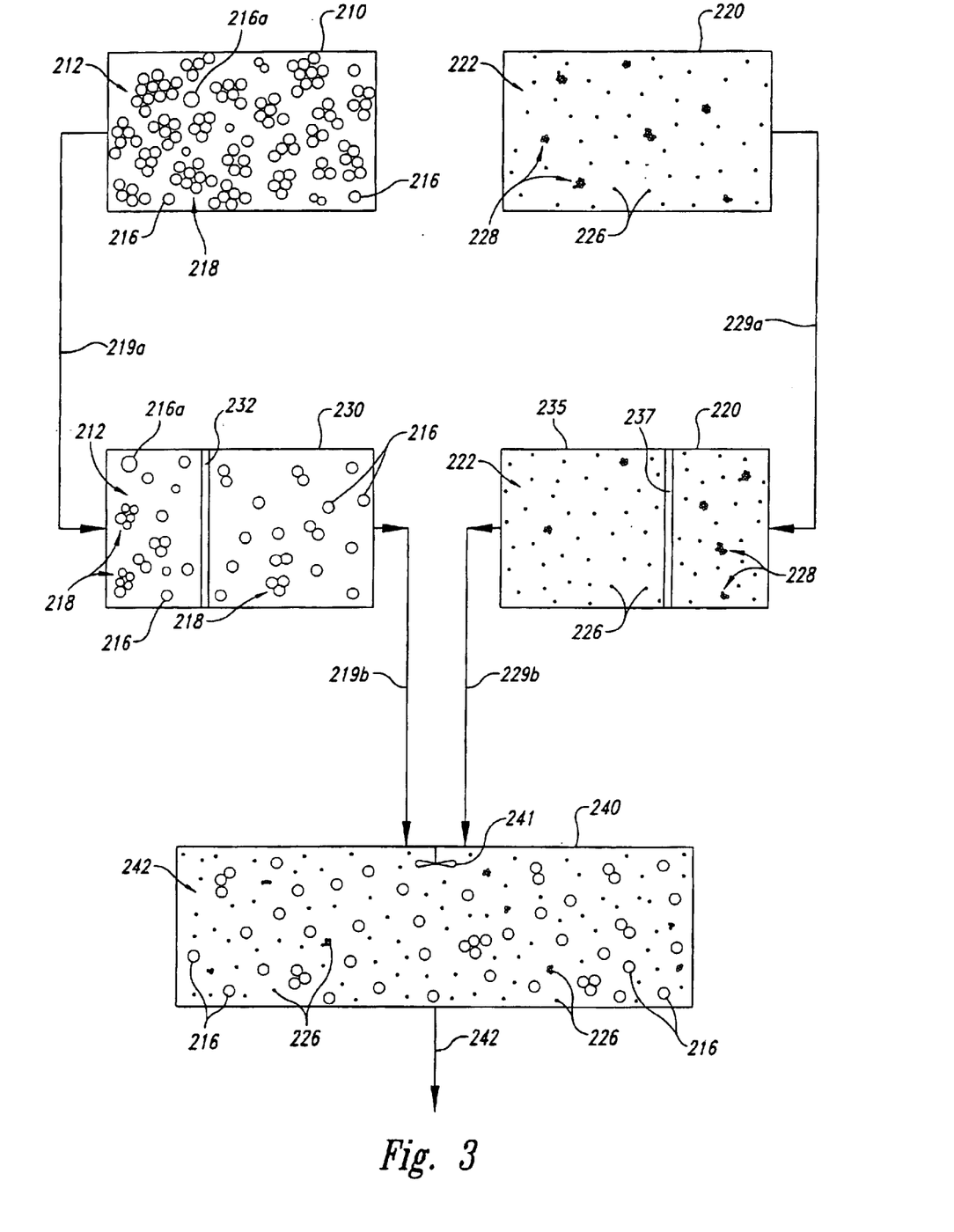
FIG. 3 is a block diagram illustrating first and second slurry solutions being processed according to a method for making a planarizing solution in accordance with an embodiment of the invention.

FIG. 3 is a schematic view illustrating the operation of the embodiment of the slurry manufacturing assembly 200 shown in FIG. 2. Referring to FIGS. 2 and 3 together, an untreated flow of the first solution 212 initially flows to the first particle removal unit 230 through a first segment of the first feed line 219a, and an untreated flow of the second solution 222 initially flows to the second particle removal unit 235 through a first segment of the second feed line 229a. The first particle removal unit 230 passes the untreated flow of the first solution 212 through the filter 232 to remove large individual first abrasive particles 216a and large first particle agglomerations 218 from the first solution 212. A treated portion of the first solution 212 then passes from the first particle removal unit 230 through a second segment of the first feed line 219b and into the mixing unit 240. The second particle removal unit 235 separately passes the untreated flow of the second solution 222 through the filter 237 to remove the large individual abrasive particles 226 and second particle agglomerations 228 from the untreated second solution 222 to create a treated flow of the second solution 222. The second particle removal unit 235 then passes the treated flow of the second solution 222 through a second segment of the second feed line 229b and into the mixing unit 240.

The mixing unit 240 then mixes the treated first and second solutions 212 and 222 together by using an agitator 241, turbulence within a conduit, and/or other suitable devices for adequately mixing the first and second solutions 212 and 222. The combination of the first and second solutions 212 and 222 forms an abrasive slurry 242 with a first particle size distribution of larger first abrasive particles 216 about a first mode and a second particle size distribution of smaller second abrasive particles 226 about a second mode.

Figure 4:
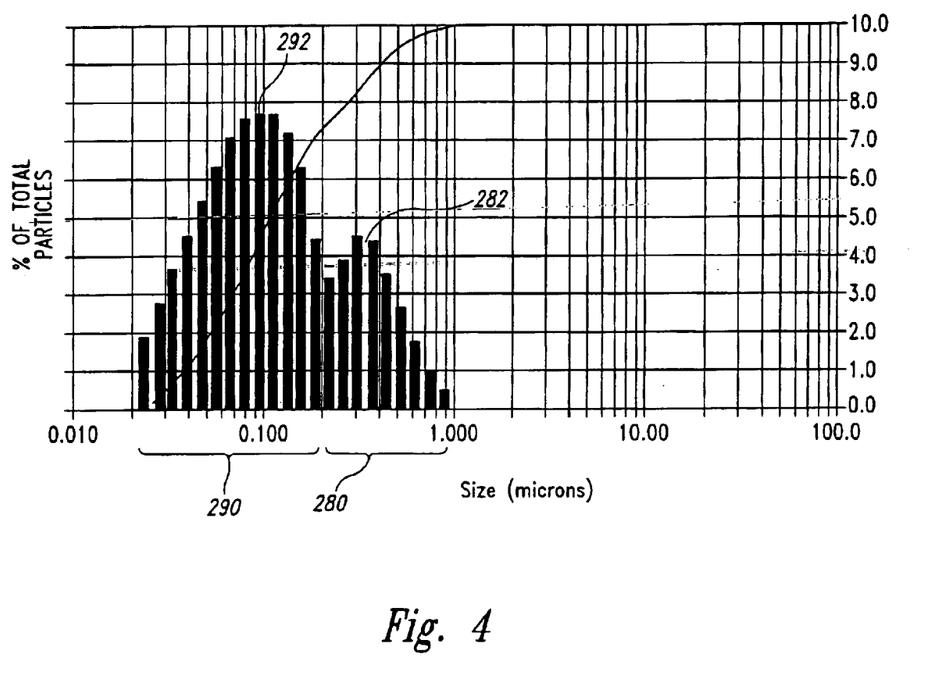
FIG. 4 is a bar graph illustrating a slurry made using a slurry manufacturing assembly and method in accordance with one embodiment of the invention having a bi-modal particle size distribution including a first size distribution of first abrasive particles about a first mode and a second size distribution of smaller second abrasive particles about a second mode.

FIG. 4 is a bar graph illustrating a bi-modal particle size distribution of the planarizing slurry 242 having a first particle size distribution 280 from approximately 0.20–1.0 μm of the larger first abrasive particles 216 (FIG. 2) and a second particle size distribution 290 from approximately 0.020–0.20 μm of the smaller second abrasive particles 226 (FIG. 2). The first particle size distribution 280 has a first mode 282 identifying that a significant percentage of the first abrasive particles 216 have particle sizes of approximately 0.3–0.4 μm. The second particle size distribution 290 has a second mode 292 identifying that a significant percentage of the second abrasive particles 226 have particle sizes of approximately 0.07–014 μm. In another embodiment (not shown), the first particle size distribution is from approximately 0.070–0.400 μm with a first mode at approximately 0.250–0.300 μm, and the second particle size distribution is from approximately 0.010–0.050 μm with a second mode at approximately 0.020–0.030 μm.

The embodiment of the slurry manufacturing assembly 200 and the method of manufacturing the slurry 242 described above with reference to FIGS. 2 and 3 are expected to produce bi-modal planarizing slurries with consistent first and second particle size distributions. One aspect of the embodiment of FIGS. 2–4 is the discovery that conventional filtering processes for a bi-modal slurry produce inconsistent particle size distributions because the filters remove a disproportionate percentage of the larger first abrasive particles after operating for a period of time. This phenomenon may occur because a common filter sized to remove the upper end of the larger particles is generally too large to also remove agglomerations of the smaller particles. Moreover, as the filter becomes loaded with abrasive particles, the removal rate of larger abrasive particles increases without necessarily increasing the removal rate of the smaller second abrasive particles. The slurry manufacturing system 200 and the methods for making the slurry 242 reduce variations in the first and second particle size distributions because the first and second solutions 212 and 222 are filtered separately to provide more consistent filtering of the individual solutions. The slurry manufacturing system 200 is accordingly expected to have less loading of the filters in a manner that removes a disproportionate percentage of the first abrasive particles 216 from the planarizing solution 242. Thus, the manufacturing system 200 and the methods for manufacturing the planarizing slurry 242 are expected to provide more consistent first and second particle size distributions in a bi-modal slurry.

The bi-modal slurry 242 manufactured in accordance with the method described above with reference to FIGS. 2 and 3 is also expected to produce good planarizing results. Small abrasive particles are expected to planarize highly topographic surfaces much faster than large abrasive particles. Once the surface of the substrate assembly becomes planar, however, slurries with small particles may have a much slower removal rate than slurries with large particles. The bi-modal planarizing solution 242 manufactured in accordance with the embodiment of FIGS. 2–4 includes the small second abrasive particles 226 to provide selective removal of high areas on the substrate surface at an initial stage of a planarizing cycle while the substrate surface has topographical variations. The bi-modal slurry 242 also includes the larger first abrasive particles 216 for maintaining a high removal rate once the substrate surface becomes planar. The planarizing solution 242 accordingly provides selective removal of the topographical features to form a planar surface on the substrate assembly, and then maintains a high removal rate of material from the blanket surface to expediently planarize the substrate assemblies.

Figure 5:
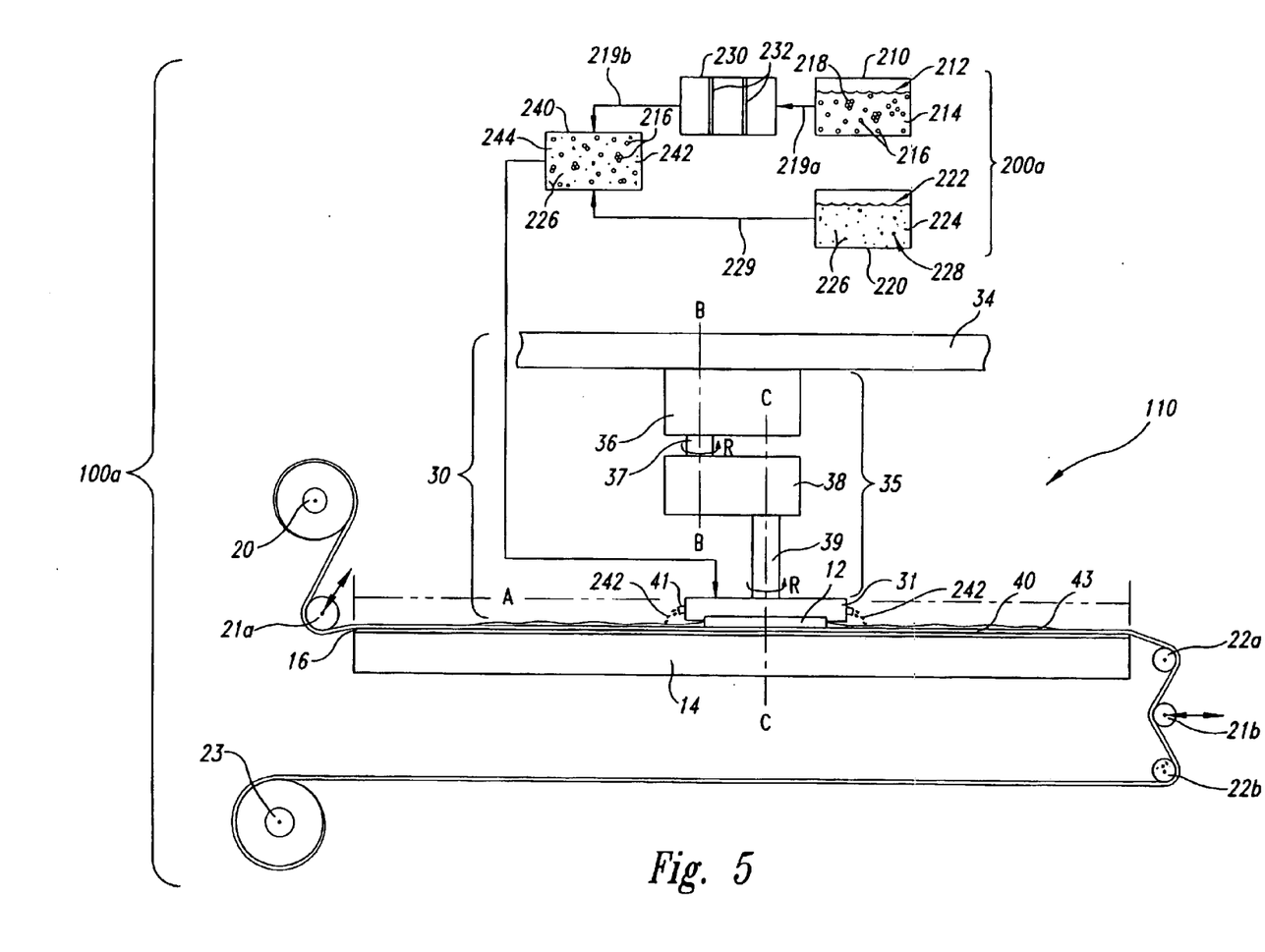
FIG. 5 is a schematic side view of a planarizing system including a planarizing machine and a slurry manufacturing assembly in accordance with another embodiment of the invention.

FIG. 5 is a schematic view illustrating a planarizing system 100a having the planarizing machine 110 and a slurry manufacturing assembly 200a in accordance with another embodiment of the invention. In this embodiment, the slurry manufacturing assembly 200a has the first supply container 210 containing the first solution 212, the second supply container 220 containing the second solution 222, and only the first particle removal unit 230 coupled to the first container 210 and the mixing unit 240. The slurry manufacturing assembly 200a accordingly only treats the flow of the first solution 212 to filter or otherwise remove the first type of selected abrasive particles from the first abrasive particles 216. The planarizing system 100a is otherwise expected to operate in a manner similar to the planarizing system 100 described above.

Referring to FIG. 2 or FIG. 5, the substrate 12 is planarized by fabricating the mixed slurry 242 and then depositing the mixed slurry 242 onto the polishing pad 40 via the nozzles 41 on the carrier head 31. As the mixed slurry 242 covers the polishing pad 40, the carrier assembly 30 presses the substrate 12 against the planarizing surface 43 of the pad 40 and translates the substrate 12 across the planarizing surface 43. Because the slurry manufacturing assemblies 200 and 200a produce slurries with consistent first and second particle size distributions, the planarizing systems 100 and 100a are expected to consistently produce highly planar and substantially defect free surfaces on the finished substrate assemblies 12.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A planarizing solution for planarizing microelectronic-device substrate assemblies, comprising:
    a liquid mixture;
    a plurality of first planarizing particles in the liquid mixture, the first planarizing particles being made from a first material selected from the group consisting of ceria, alumina, aluminum oxide, titania, and tantalum oxide and having a first planarizing attribute defined at least in part by a first particle size of 0.01–0.05 μm having a distribution with a first mode of 0.02 to 0.03 μm and
    a plurality of second planarizing particles in the liquid mixture with the first planarizing particles, the second planarizing particles having a second planarizing attribute different than the first planarizing attribute of the first planarizing particles, the second planarizing attribute being defined at least in part by a second particle size of 0.07–1.0 μm having a distribution with a second mode of 0.25 to 0.4 μm.

2. The planarizing solution of claim 1 wherein the first mode of the first particle size distribution is approximately 0.020–0.030 μm and the second mode of the second particle size distribution is approximately 0.250–0.300 μm.

3. The planarizing solution of claim 1 wherein the first attribute of the first particles is further defined by a first material and the second attribute of the second particles is further defined by a second material different than the first material.

4. The planarizing solution of claim 1 wherein the substrate assembly has a cover layer and an underlying layer under the cover layer, the first attribute of the first particles is further defined by a first material and the second attribute of the second particles is further defined by a second material different than the first material, and the first material aggressively removing matter from the cover layer and the second material removing matter from the underlying layer less aggressively than from the cover layer.

5. The planarizing solution of claim 1 wherein the substrate assembly includes a cover layer and an underlying layer under the cover layer, and wherein the first distribution of first abrasive particles selectively remove high regions on topographical substrate surfaces and the first material aggressively removes matter from the cover layer, and the second distribution of second abrasive particles dominate removal of material from planar substrate surfaces and are made from a second material that removes matter less aggressively from the underlying layer than the cover layer.

6. The planarizing solution of claim 1 wherein the substrate assembly includes a cover layer and an underlying layer under the cover layer, and wherein the first distribution of first abrasive particles selectively remove high regions on topographical substrate surfaces and the first material aggressively removes matter from the cover layer, and the second abrasive particles dominate removal of material from planar substrate surfaces and are made from a second material that removes matter from the cover layer less aggressively than the first material of the first abrasive particles.

7. The planarizing solution of claim 1 wherein the second particles are made of a second material selected from the group consisting of ceria, alumina, aluminum oxide, titania, and tantalum oxide, cerium treated with silica and silica.

8. The planarizing solution of claim 7 wherein the second material is different than the first material.

9. The planarizing solution of claim 7 wherein the first material is selected from the group consisting of ceria and alumina and the second material is selected from the group consisting of silica and titania.

10. The planarizing solution of claim 7 wherein the first material is ceria and the second material is silica.

11. The planarizing solution of claim 7 wherein the first material is alumina and the second material is titania.

12. A planarizing solution for planarizing microelectronic-device substrate assemblies, comprising:

a liquid mixture;

a plurality of first planarizing particles made of a material selected from the group consisting of alumina, aluminum oxide, titania, and tantalum oxide, in the liquid mixture, the first planarizing particles having a first planarizing attribute defined at least in part by a first particle size of 0.01 to 0.200 $\mu$m having a distribution with a first mode of 0.02–0.15 $\mu$m; and a plurality of second planarizing particles in the liquid mixture with the first planarizing particles, the second planarizing particles having a second planarizing attribute different than the first planarizing attribute of the first planarizing particles, the second planarizing attribute being defined at least in part by a second particle size of 0.07–1.0 $\mu$m having distribution with a second mode of 0.25 to 0.4 $\mu$m, with the proviso that the second mode for the size distribution for the second particles is larger than the first mode for the size distribution for the first particles.

13. The planarizing solution of claim 12 wherein the second particles are made of a second material selected from the group consisting of ceria, alumina, aluminum oxide, titania, and tantalum oxide, cerium treated with silica and silica.

14. The planarizing solution of claim 13 wherein the first material is alumina and the second material is silica.

15. The planarizing solution of claim 13 wherein the first material is alumina and the second material is titania.

16. The planarizing solution of claim 12 wherein the first particle size is from approximately 0.020–0.20 $\mu$m with a distribution having the first mode of approximately 0.09–0.15 $\mu$m, and the second particle size is approximately 0.2–1.0 $\mu$m with a distribution having the second mode of approximately 0.3–0.4 $\mu$m.

17. The planarizing solution of claim 12 wherein the first particle size is from approximately 0.01–0.05 $\mu$m with a distribution having the first mode of approximately 0.02–0.03 $\mu$m, and the second particle size is approximately 0.07–0.4 $\mu$m with a distribution having the second mode of approximately 0.25–0.3 $\mu$m.

18. The planarizing solution of claim 12 wherein the first mode of particle size is selected to more aggressively planarize a topographical cover layer than the second mode of particle size, and the second mode of particle size is selected to more aggressively planarize a blanket layer comprised of silica than the first mode of particle size.

* * * * *